US011705373B2

(12) United States Patent
Moody et al.

(10) Patent No.: US 11,705,373 B2
(45) Date of Patent: Jul. 18, 2023

(54) IN SITU MONITORING OF FIELD-EFFECT TRANSISTORS DURING ATOMIC LAYER DEPOSITION

(71) Applicant: NORTHWESTERN UNIVERSITY, Evanston, IL (US)

(72) Inventors: Michael J. Moody, Chicago, IL (US); Lincoln J. Lauhon, Chicago, IL (US); Ju Ying Shang, Romeoville, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 323 days.

(21) Appl. No.: 17/197,654

(22) Filed: Mar. 10, 2021

(65) Prior Publication Data
US 2021/0287949 A1 Sep. 16, 2021

Related U.S. Application Data

(60) Provisional application No. 62/987,553, filed on Mar. 10, 2020.

(51) Int. Cl.
*H01L 21/66* (2006.01)
*C23C 16/52* (2006.01)
(Continued)

(52) U.S. Cl.
CPC ............ *H01L 22/14* (2013.01); *C23C 16/52* (2013.01); *G01R 31/2621* (2013.01); *H01L 21/67253* (2013.01)

(58) Field of Classification Search
CPC ............... H01L 22/14; H01L 21/67253; H01L 21/02568; H01L 21/0262; C23C 16/52;
(Continued)

(56) References Cited

U.S. PATENT DOCUMENTS 6,166,354 A 12/2000 Hause et al.
6,667,070 B1 12/2003 Adem
(Continued)

FOREIGN PATENT DOCUMENTS

JP 2001150160 A 6/2001
WO WO-2023021007 A1 * 2/2023

*Primary Examiner* — John P. Dulka
(74) *Attorney, Agent, or Firm* — Benesch, Friedlander, Coplan & Aronoff LLP

(57) ABSTRACT

A system and method for performing in-situ measurements of semiconductor devices during chemical vapor deposition (CVD) includes disposing a chip carrier within a sealed chamber of a reactor for carrying out in-situ monitoring of partially fabricated semiconductor devices. The chip carrier includes a plurality of metallized bonding pads disposed along both peripheral edges on a same surface of the base for making electrical connections to metallized pads or contacts on the semiconductor device through bonding wires. Each of the plurality of metallized bonding pads disposed along both peripheral edges is electrically connected to each other as a pair through electrically connecting to a corresponding pair of ports which are disposed along both peripheral edges of the chip carrier. In-situ monitoring of the partially fabricated semiconductor device is performed through connecting the plurality of ports on the chip carrier to an external source-measure unit through a connector and wire harness.

20 Claims, 11 Drawing Sheets

(51) Int. Cl.
*G01R 31/26* (2020.01)
*H01L 21/67* (2006.01)

(58) Field of Classification Search
CPC ............ C23C 16/305; C23C 16/45544; G01R 31/2621
See application file for complete search history.

(56) References Cited

U.S. PATENT DOCUMENTS

| | | | |
|---|---|---|---|
| 7,151,389 B2* | 12/2006 | Raichman | G01R 31/31926 324/73.1 |
| 7,816,152 B2 | 10/2010 | Yoo et al. | |
| 10,048,306 B1* | 8/2018 | Darbha | G01R 31/2896 |
| 2008/0254553 A1* | 10/2008 | Yoo | H01L 22/14 438/10 |
| 2009/0177410 A1* | 7/2009 | Konishi | H01L 21/67069 702/57 |
| 2010/0045325 A1* | 2/2010 | Doong | H01L 22/34 257/E23.079 |
| 2016/0181073 A1* | 6/2016 | Liu | H01L 21/3065 422/186 |
| 2019/0286111 A1* | 9/2019 | Yennie | H01L 21/67253 |
| 2019/0311884 A1* | 10/2019 | Kobayashi | H01J 37/32568 |

* cited by examiner

IN SITU MONITORING OF FIELD-EFFECT TRANSISTORS DURING ATOMIC LAYER DEPOSITION

CROSS-REFERENCE

This disclosure claims priority to and the benefit from U.S. Provisional Patent Application Ser. No. 62/987,553 titled "In Situ Monitoring of Field-Effect Transistors During Atomic Layer Deposition", filed on Mar. 10, 2020, which is herein incorporated by reference in its entirety.

STATEMENT OF FEDERALLY FUNDED RESEARCH OR SPONSORSHIP

This disclosure was made with government support under grant number NSF 1433510 awarded by the National Science Foundation, and grant number 70NANB14H012 awarded by the National Institute of Standards and Technology (NIST). The government has certain rights in the invention.

TECHNICAL FIELD

This disclosure relates to a chip carrier for semiconductor devices' in-situ measurement of electrical properties during chemical vapor deposition (CVD) and during atomic layer deposition (ALD).

BACKGROUND

Semiconductor devices' electrical properties measurements are often performed after deposition is finished. For real-time information, depositions were optically monitored, or in some cases "quasi-in-situ" techniques had been used, where the semiconductor device is removed from the deposition process for measurement and needs to be put back to the reactor to continue deposition process after measurement. The monitoring cannot be performed in real-time and the handling and transiting increases risks of damaging the semiconductor device in addition to subjecting the measurements to be error prone.

The description provided in the background section should not be assumed to be prior art merely because it is mentioned in or associated with the background section. The background section may include information that describes one or more aspects of the subject technology.

SUMMARY OF THE DISCLOSURE

Systems and methods for in-situ monitoring of semiconductor devices during atomic layer deposition are provided. According to an embodiment as shown in FIGS. 1A and 3B, for example, the in-situ monitoring system 100 may include a reactor 102 having a sealed chamber 102a for carrying out chemical vapor deposition (CVD) on semiconductor devices, wherein the reactor 102a is configured with a plurality of openings 142, 144, 146, for passaging of reactive gases 104a, 104b, 104c and for in-situ monitoring of the semiconductor devices within the sealed chamber 102a during the CVD. The system 100 includes a chip carrier 120 (see FIGS. 1A to 1C) disposed within the sealed chamber 102a, wherein the chip carrier 120 is configured for mounting at least one partially fabricated semiconductor device (i.e., device under test DUT 106) on a base 107, wherein the chip carrier 120 includes a plurality of metallized bonding pads 120a-120n and 123a-123n disposed along both peripheral edges 107a, 107b on a same surface of the base 107 for making electrical connections to one or more metallized pads or contacts 106a, 106b on the at least one partially fabricated semiconductor device (DUT 106) through bonding wires 108a, 108b, such that each of the plurality of metallized bonding pads 106a, 106b is individually and electrically connected to respective plurality of ports 121a-121n and 125a-125n on the chip carrier 120 for in-situ monitoring of electrical parameters of the at least one partially fabricated semiconductor device 106 during the CVD process. During the monitoring, electrical currents or electrical signals (e.g., channel current IDS, drain voltage VD, source voltage VS, gate voltage VG, etc.) may be exchanged between the at least one partially fabricated semiconductor device 106 and a source-measure unit (SMU) 140 disposed external to the sealed chamber 102 through a connector 122 and wire harness 126a-126n that is electrically coupled to the plurality of ports 121a-121n on one peripheral edge 107a of the chip carrier 120. The SMU 140 may include a plurality of measurement equipment configured to perform in-situ measurements of the electrical parameters of the at least one partially fabricated semiconductor device 106 during the CVD.

According to another aspect of the disclosure, there is shown in FIGS. 1A, 2 and 3B, for example, a method for in-situ monitoring of semiconductor devices during atomic layer deposition. The method may include: disposing a chip carrier 120 within a sealed chamber 102a of a reactor 102 for carrying out in-situ monitoring of semiconductor devices within the sealed chamber 102a during chemical vapor deposition (CVD), wherein the reactor 102a is configured with a plurality of openings 142, 144, 146 for passaging of reactive gases 104a-104c and for in-situ monitoring of the semiconductor devices during the CVD. In an example, the chip carrier 120 may be configured for mounting at least one partially fabricated semiconductor device (e.g., DUT 106) on a base 107, and the chip carrier 120 includes a plurality of metallized bonding pads 120a-120n and 123a-123n disposed along both peripheral edges 107a, 107b on a same surface of the base 107 for making electrical connections to one or more metallized pads or contacts 106a, 106b on the at least one partially fabricated semiconductor device (DUT 106) through bonding wires 108a, 108b, such that each of the plurality of metallized pads or contacts 106a, 106b is individually and electrically connected to respective plurality of ports 121a-121n and 125a-125n on the chip carrier 120 for in-situ monitoring of electrical parameters of the at least one partially fabricated semiconductor device 106 during the CVD process. During the monitoring, electrical currents or electrical signals (e.g., channel current IDS, drain voltage VD, source voltage VS, gate voltage VG, etc.) may be exchanged between the at least one partially fabricated semiconductor device 106 and a source-measure unit (SMU) 140 disposed external to the sealed chamber 102 through a connector 122 and wire harness 126a-126n that is electrically coupled to the plurality of ports 121a-121n on one peripheral edge 107a of the chip carrier 120. The method may include performing by a plurality of measurement equipment of the SMU 140, in-situ measurements of the electrical parameters of the at least one partially fabricated semiconductor device 106 during the CVD.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The disclosure may be better understood with reference to the following drawings and description. The elements in the figures are not necessarily drawn to scale, emphasis instead being placed upon illustrating the principles of the disclosure. Moreover, in the figures, like-referenced numerals may designate to corresponding parts in the different figures. Throughout the disclosure, the term "atomic vapor deposition" may be an alternative to "chemical vapor deposition" types, and the term "Field Effect Transistors (FET)", "Device Under Test (DUT)" and "partially fabricated semiconductor device" may be used interchangeably with the same reference designation. The term "channel" may use a same reference designation for the transition metal dichalcogenides (TMDs) and two-dimensional (2D) materials.

Both chemical vapor deposition (CVD) including ALD are thin film deposition processes used in microelectronic fabrication to achieve repeatable final electrical characteristics which are key to maintaining a high consistent yield to keep cost low. In-situ, real time information about a process may help to understand and improve both development and production, thus accelerating development of deposition processes where the resulting electrical properties are of interest.

In Atomic Layer Deposition (ALD) process, one of the most promising channel candidates as a substitution for silicon in modern electronics devices are Transition-Metal-Dichalcogenides (TMDs). TMDs are semiconductors in the form of $MX_2$ two dimensional (2D) monolayers, where M is a transition metal (Mo, W, Hf), and X is a chalcogen (S, Se, Te). The weak Van-Der-Waals forces between each 2D monolayer of the $MX_2$ are suitable for logic devices with better electrostatic control and better immunity to short-channel effects, earning the attention of the electronics and optoelectronics community.

Processes compatible with obtaining thin film or few monolayers of TMD materials include Atomic Layer Deposition (ALD) which may be used in order to grow $MoS_2$ by sulphurization of the transition metal (such as Mo, W, Hf). Two-dimensional (2D) molybdenum disulfide ($MoS_2$) is an attractive alternative semiconductor material for next-generation low-power nano-electronic applications, due to its special structure and large bandgap. In addition, the mobility of the TMDs in 2D layers may be tuned to a higher mobility and to yield good modulation output characteristics by the back gate.

Figure 1A:
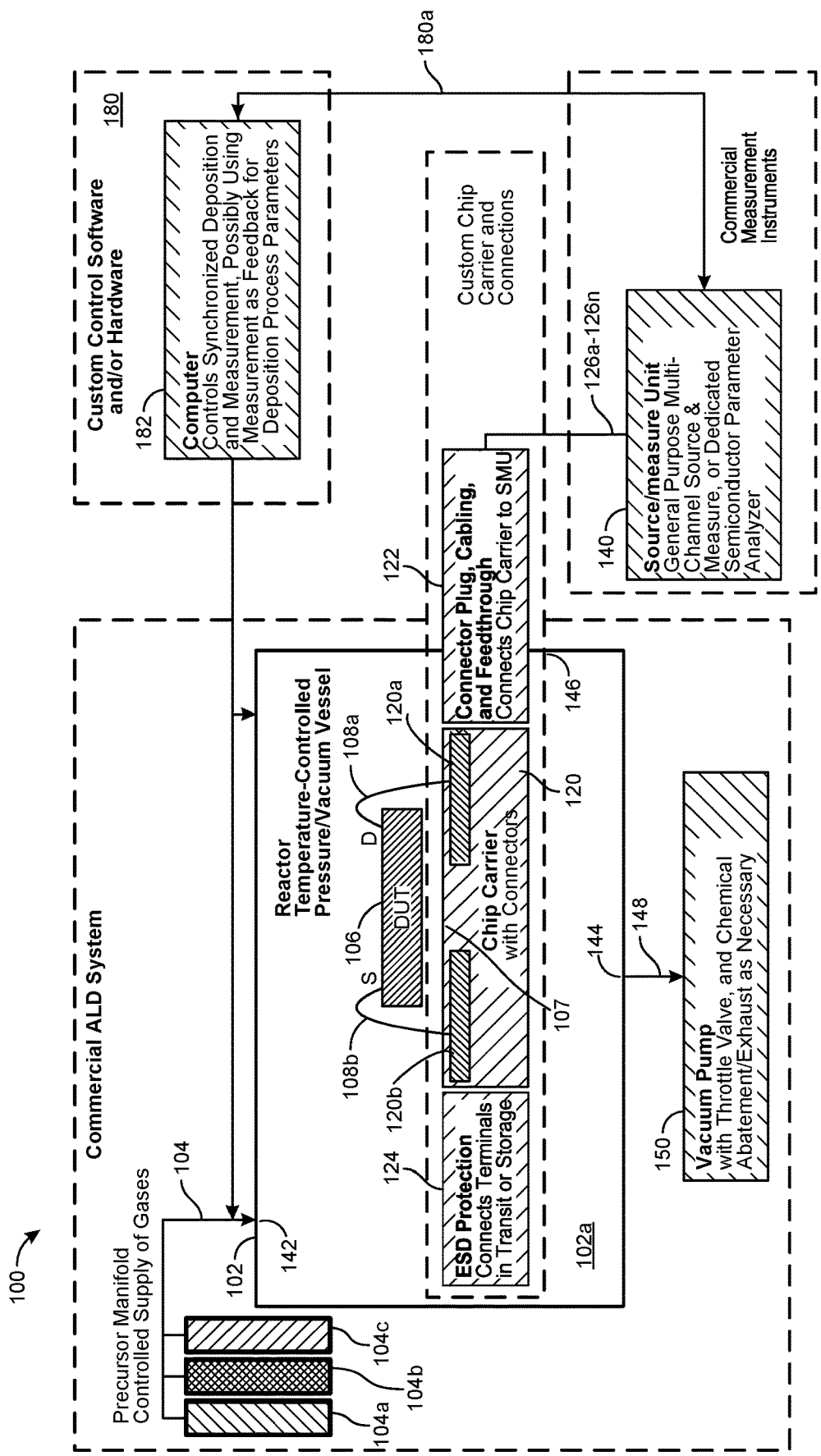
FIG. 1A illustrates an in-situ monitoring of Field Effect Transistors (FETs) during chemical vapor deposition (CVD) or during atomic layer deposition (ALD).

FIG. 1A illustrates an in-situ monitoring of Field Effect Transistors (FETs) during chemical vapor deposition (CVD) or during atomic layer deposition (ALD). According to an embodiment as shown in FIGS. 1A and 3B, the system 100 may include a reactor 102 having a sealed chamber 102a for carrying out CVD or atomic layer deposition (ALD) on semiconductor devices. In an example, the reactor 102a may be configured with a plurality of openings 142, 144, 146, for passaging (i.e., inflow 104 and exhaust 148) of reactive gases 104a, 104b, 104c for deposition processing and for in-situ monitoring of the semiconductor devices within the sealed chamber 102a during the CVD or ALD. The reactive gases 104a, 104b, 104c may be precursor gases for chemical deposition and for oxidation which are controlled and synchronized to release through a manifold by a custom control software and/or hardware platform 180. In an embodiment, the custom control software and/or hardware platform 180 may include a server or a computer running a custom control software 182 to control a source measurement unit 140 (SMU) to perform in-situ measurements. The in-situ measurement information may be feedback parameters 180a to be used to control the release of the reactive gases for the CVD or ALD processing.

The system 100 also includes a chip carrier 120 (see FIGS. 1A to 1C), configured to be disposed within the sealed chamber 102a for in-situ monitoring of channel current or monitoring of oxidation of channel materials to tune for carrier mobility performance. The chip carrier 120 may be configured for mounting at least one partially fabricated semiconductor device (i.e., device under test DUT 106) on a base 107. The chip carrier 120 includes a plurality of metallized bonding pads 120a-120n and 123a-123n disposed along both peripheral edges 107a, 107b on a same surface of the base 107 for making electrical connections to the metallized pads or contacts 106a, 106b on the partially fabricated semiconductor device (DUT 106) through bonding wires 108a, 108b. Accordingly, the plurality of metallized bonding pads or contacts 106a, 106b may be individually and electrically connected to respective plurality of ports 121a-121n and 125a-125n on the chip carrier 120 for electrostatic discharge (ESD) protection or for in-situ monitoring of electrical parameters of the partially fabricated semiconductor device 106 during the CVD or ALD process. During the CVD or ALD, electrical currents or electrical signals (e.g., channel current IDS, drain voltage VD, source voltage VS, gate voltage VG, etc.) of the partially fabricated semiconductor device 106 may be monitored by a source-measure unit (SMU) 140 disposed external to the sealed chamber 102 through a connector and wire harness 122, which cables 126a-126n from the connector and wire harness are electrically connected to the plurality of ports 121a-121n through the feedthrus 122a-122n. The SMU 140 may include a plurality of measurement equipment configured to perform in-situ measurements of the electrical parameters of the partially fabricated semiconductor device 106 during the CVD or ALD.

Figure 1B:
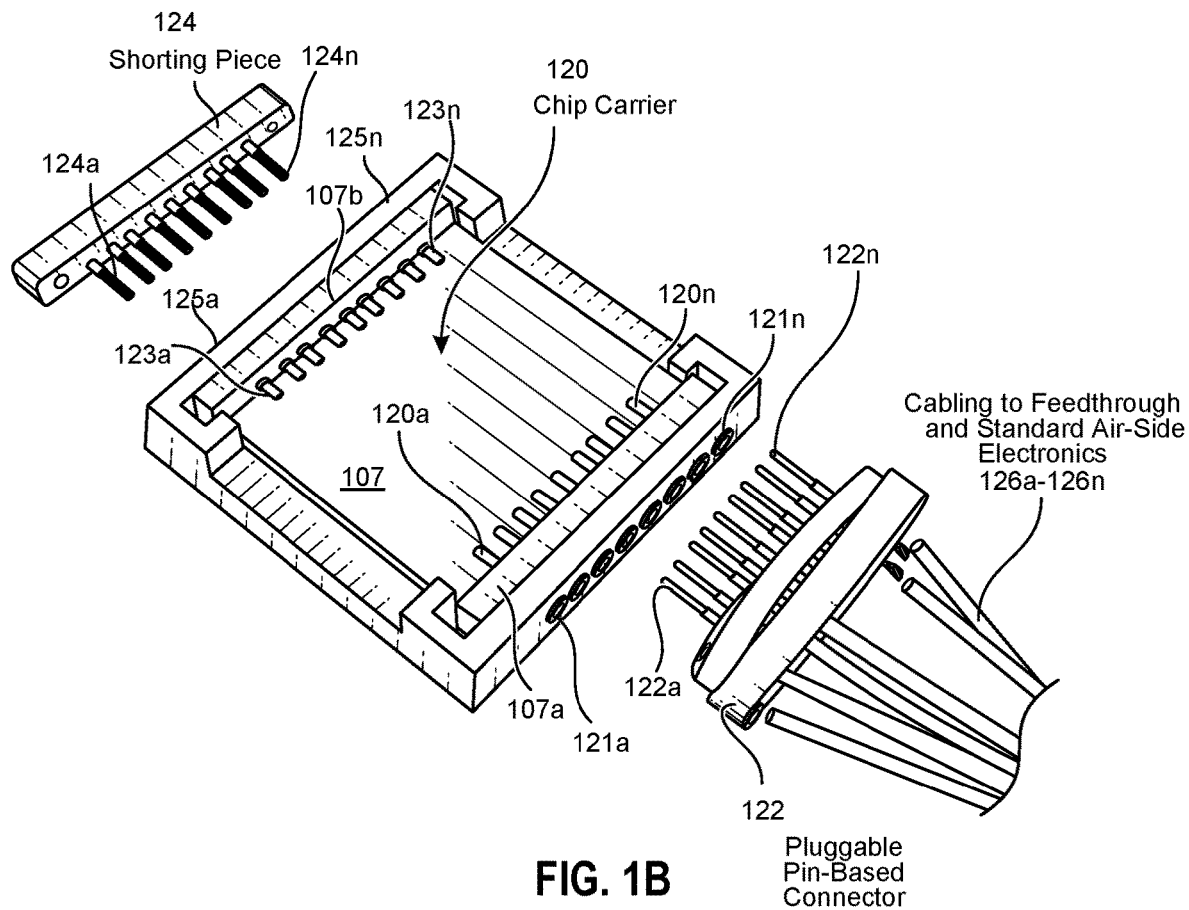
FIG. 1B illustrates a chip carrier and a cable harness for carrying out in-situ monitoring of Field Effect Transistors (FETs) during atomic layer deposition.
Figure 1C:
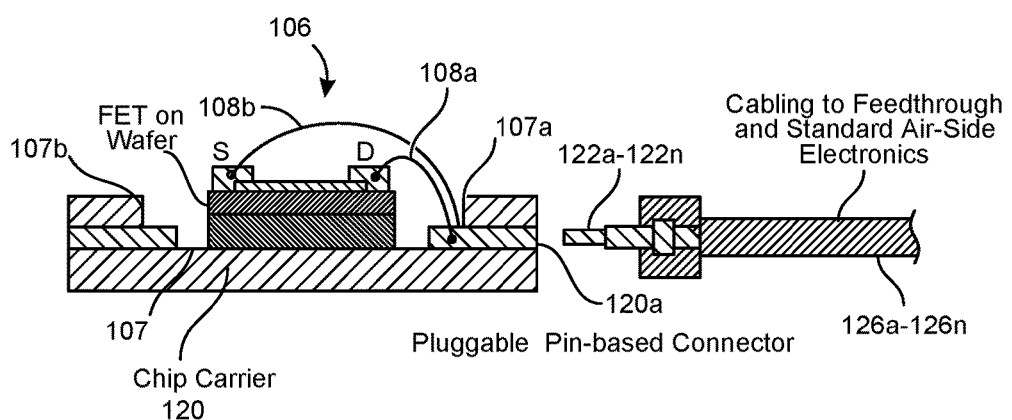
FIG. 1C illustrates a close up view of a back-gated FET being mounted on a chip carrier with connecting cable harness for carrying out in-situ monitoring of Field Effect Transistors (FETs) during atomic layer deposition.

FIG. 1B illustrates a chip carrier 120 and a cable harness 122 for carrying out in-situ monitoring of Field Effect Transistors (FETs) 106 during the CVD or ALD. Also shown in FIG. 1B is a shorting piece 124 for electrostatic discharge (ESD) mitigation during transport. FIG. 1C illustrates a close up view of a back-gated FET 106 being mounted on a chip carrier 120. The metallized contacts or pads (drain D and source S) on the back-gated FET 106 may be electrically connected to the plurality of ports 120a-120n through the bond wires 108a, 108b, which in turn may be electrically connected with feedthrus 122a-122n of a connector cable harness 122 for carrying out in-situ monitoring during the atomic layer deposition.

FIG. 1B shows that the chip carrier 120 may include a plurality of metallized bonding pads 120a-120n and 123a-123n disposed along both peripheral edges 107a, 107b which are in turn electrically connected to ports 121a-121n and 125a-125n respectively, on the chip carrier 120. The plurality of ports 121a-121n on the one side of the peripheral edge 107a of the carrier chip 120 are configured for mating to respective plurality of jacks or plugs 122a-122n of the connector and wire harness 122. Likewise, the plurality of ports 125a-125n on the another side of the peripheral edge 107b of the carrier chip 120 are configured for mating to respective plurality of jacks or plugs 124a-124n of the shorting piece 124. In an example, the chip carrier 120 may be made from a high melting point polymer of PolyTetraFluoroEthylene (PTFE), such as Teflon®.

It should be noted that the plurality of ports 121a-121n along the one peripheral edge 107a are electrically connected to corresponding plurality of ports 125a-125n along another peripheral edge 107b, such that port 121a is electrically connected to corresponding port 125a, and port 121n is electrically connected to corresponding port 125n, etc.

The purpose of electrical pairing of ports connections between ports 121a-121n and ports 121a-121n on the chip carrier 120 are for ESD protection during transit including device handling, wire bonding, transport and connecting to the SMU 140 prior to electrical measurements. For example, FIGS. 1D to 1E provide a sequence of connecting and disconnecting of the shorting piece 124 and the connector wire harness 122 for ESD protection of the back-gated FET 106 prior to in-situ measurements by the SMU 140.

Figure 1D:
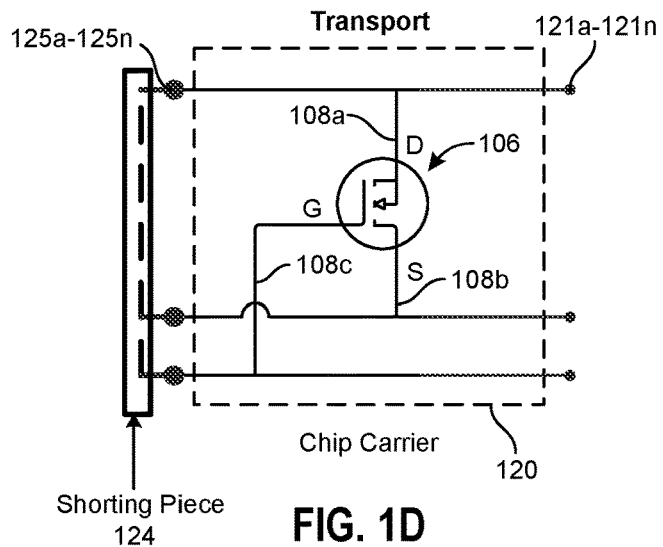
FIGS. 1D-1F illustrate schematics of a back-gated FET being mounted on a chip carrier for various handling.

As shown in FIG. 1D, a shorting piece 124 with a plurality of shorted feedthrus 124a-124n (e.g., electrically tied together) may be plugged to corresponding mating ports 123a to 123n (not shown) on the another peripheral edge 107b. Thus, by virtue of the shorting piece 124 and the corresponding pairing of ports connections between ports 121a-121n and ports 121a-121n on the chip carrier 120, a same electrical potential is rendered to all the metallized bonding pads 123a-123n and 120a-120n on the chip carrier 120 to prevent electrostatic discharge (ESD) damage to the partially fabricated back-gated FETs 106 during handling, wire bonding, transport and connection to the SMU prior to electrical measurements. The partially fabricated back-gated FETs 106 may then be wire bonded to respective metallized bonding pads 120a-120n on the one side 107a of the chip carrier 120, resulting in both the metallized drain pad 106a and the source pad 106a being electrically connected through the bond wires 108a, 108b to bonding pads 120a, 120b, and to ports 121a, 121b shorted to the shorting piece 124 to maintain a same potential through port pairing of port 121a to port 125a and port 121b to port 125b, etc. Likewise, the back gate 106f may be electrically connected to a same potential to prevent electrostatic discharge (ESD) damage through the back metallization 124f electrically connected to both ports 121f and 125f, respectively.

Figure 1E:
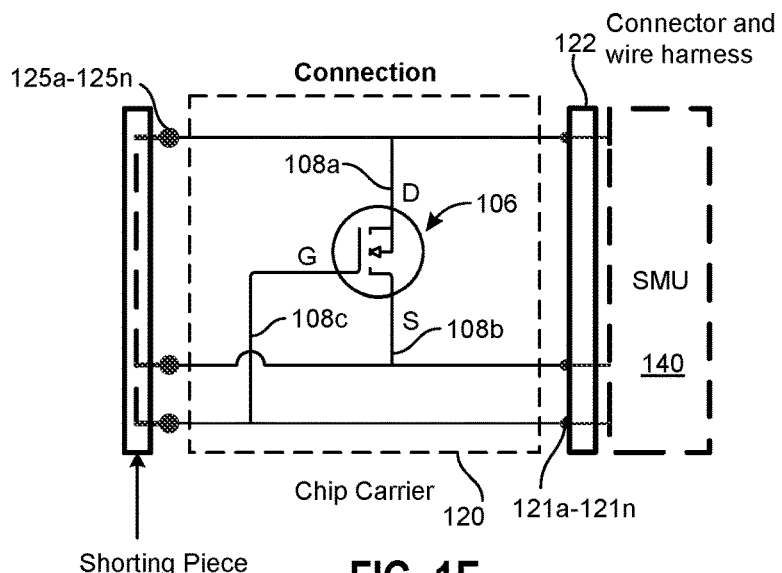

FIG. 1E shows that while the shorting piece 124 remains connected to ports 125a to 125n to short out the drain 106a, the source 106b and the back gate 106f at a same potential, the chip carrier 120 may be electrically connected to the SMU 140 through plugging the respective jack or plug 122a-122n of the connector and wire harness 122 to the corresponding mating ports 121a to 121n of the chip carrier 120 to prepare for in-situ monitoring measurements.

Figure 1F:
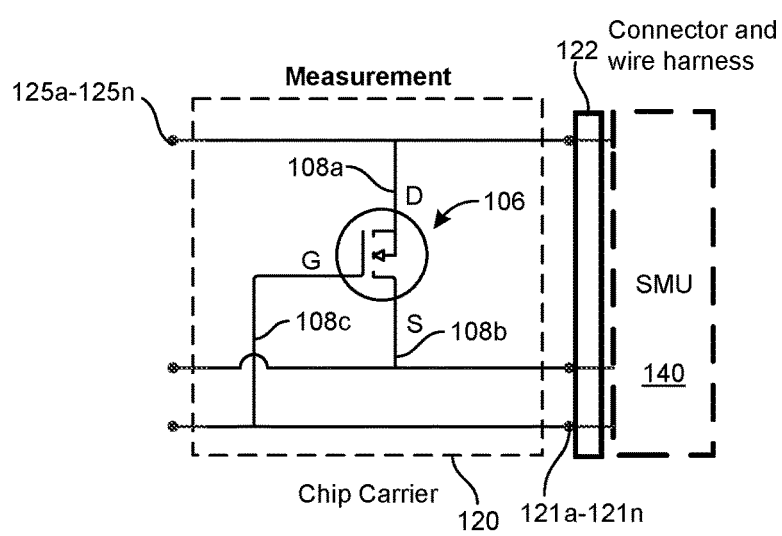

FIG. 1F shows that the shorting piece 124 on the another peripheral edge 107b is to be first removed from the chip carrier 120 prior to proceeding with the electrical parameters measurements by the SMU 140 through the connector and wire harness 122.

Figure 2:
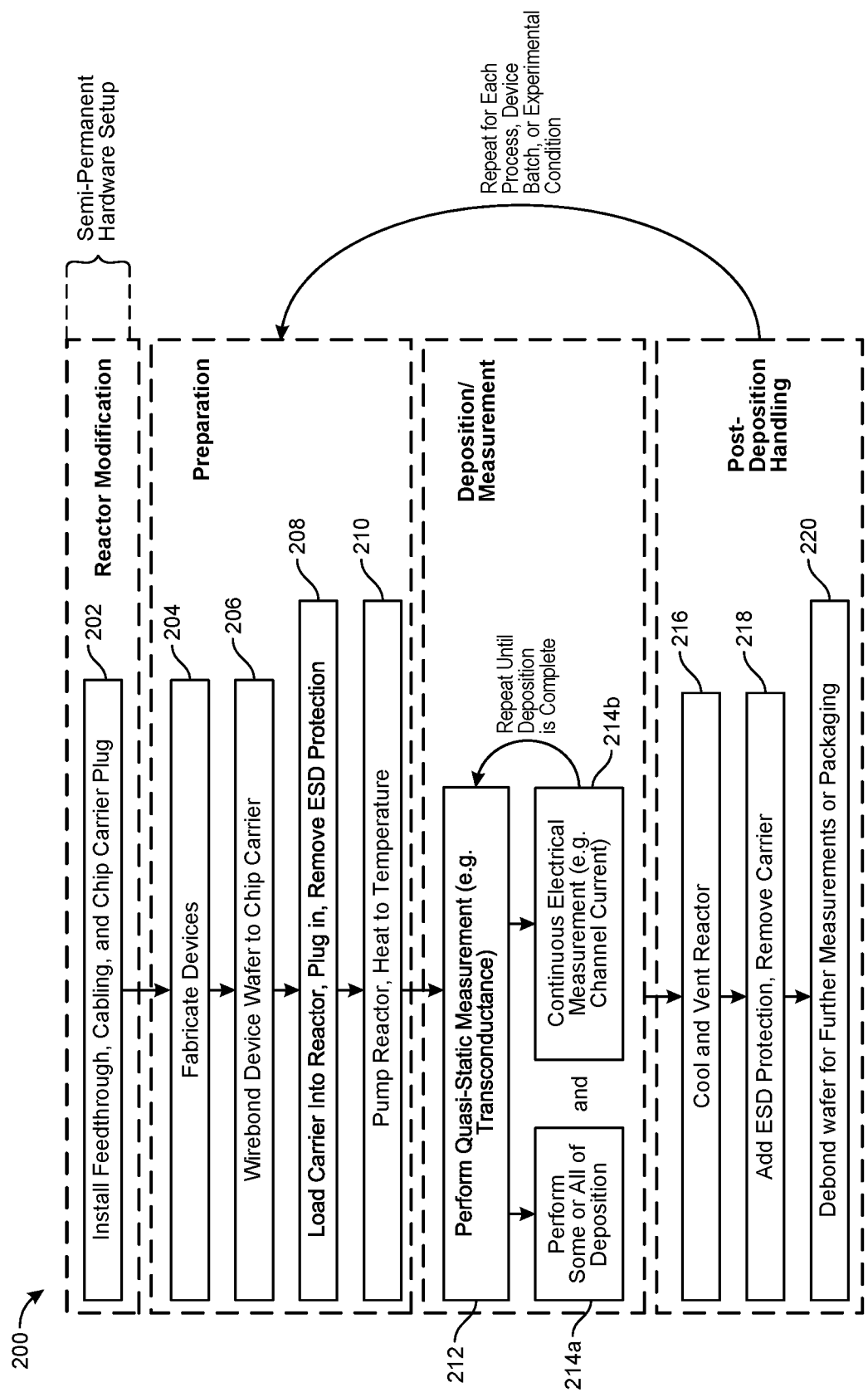
FIG. 2 illustrates a method of in-situ monitoring of Field Effect Transistors (FETs) during chemical vapor deposition (CVD) or during atomic layer deposition (ALD).

FIG. 2 illustrates a process or a method of in-situ monitoring of Field Effect Transistors (FETs) during the CVD or ALD. The process may include reactor modification (see step 202), chip carrier preparation (steps 204-210), in-situ deposition measurement (steps 212 to 214a, 214b) and post deposition handling (steps 216).

In step 202, the reactor 102 may be modified to include installing the feedthrus and cabling (e.g., connector and wire harness 122) inside the sealed chamber 102a through an opening 146.

In step 204, the DUT 106 is being fabricated partially at least to provide the metallized pads or contacts 106a, 106b available for wire bonding. In step 206, the shorting piece 124 may be plugged to the ports 125a-125n to short out the bonding pads 123a-123n and 120a-120n on the chip carrier 120 for electrostatic discharge (ESD) protection. The DUT 106 may be mounted onto a base 107 of the chip carrier 120, upon which the source pad 106a and drain pad 106b may be wire-bonded onto the corresponding bonding pads 120a-120n. The chip carrier 120 may be loaded back to the sealed chamber 102a. In step 208, the DUT 106 on the chip carrier may be plugged to the connector and wire harness 122, and the shorting piece 124 may be then removed to prepare to perform the in-situ device monitoring during the CVD or ALD processing. In step 210, the sealed chamber 102a may be pumped by a pump to near vacuum through opening 144, which the sealed chamber 102a may be heated to a temperature suitable for CVD or ALD oxide growth on unmasked area 106d (e.g., channel gap) and for tuning of mobility measurements through oxide encapsulation thickness monitoring.

In step 212, in-situ monitoring of the DUT 106 may be carried by quasi-static measurement such as transconductance measurements through passing and measuring channel currents at various gate voltages over time, while reactant gases 104a-104c are passed into the sealed chamber 102a at elevated temperature under near vacuum pressure. In step 214a one may choose to complete all of the deposition and take measurements at the end of deposition. In step 214b, one may alternately perform in-situ electrical parameters by continuously measuring in real time, the channel current. The electrical parameters from the SMU 140 may be sent back as feedback signals to server and software in the control system 180 to control the release of reactant gases 104a-104c or to control number of the cycles or duration of cycles in pulse release of reactant gases in response to the measured electrical parameters. The measured electrical parameters include measurements over a defined time period of: channel currents, transconductance, bias voltage, carrier mobility, oxide encapsulation thickness. Other parameters that may be monitored for feedback control may include chamber temperature, chamber pressure and flow rate of reactant gases.

In step 216, the reactor 102 may be cooled and the residual reactant gases in the sealed chamber 102a may be pumped out. In step 218, the sealed chamber may be opened, and the chip carrier 120 may be protected from ESD through reconnecting the shorting piece 124 to the another peripheral edge 107b of the chip carrier 120 during transport and handling. In step 220, the bond wires on the DUT 106 may be removed for further measurements or packaging.

Figure 3A:
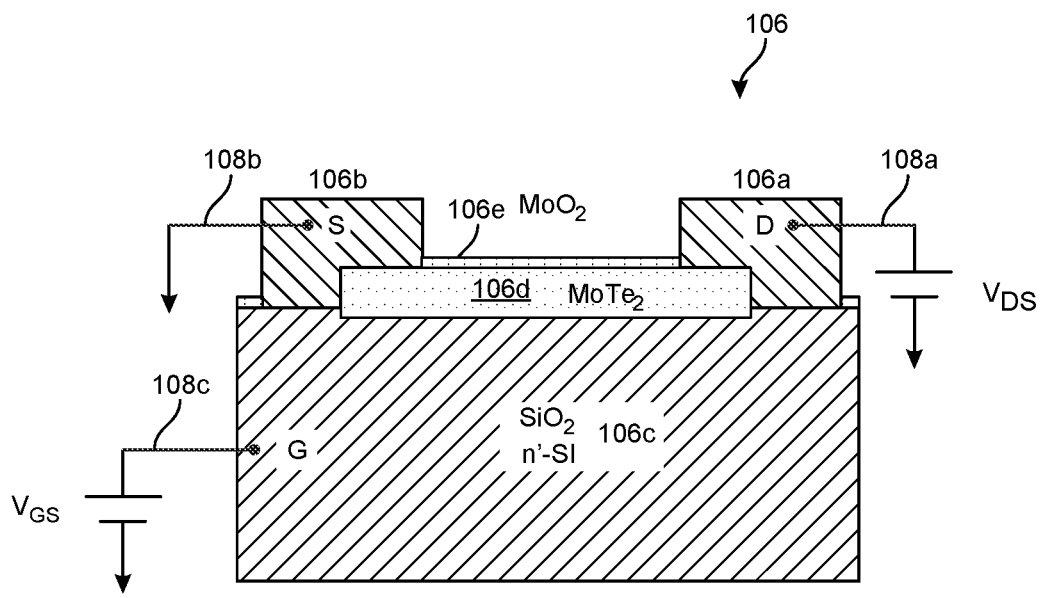
FIG. 3A illustrates a schematic of a back-gated FET.
Figure 3B:
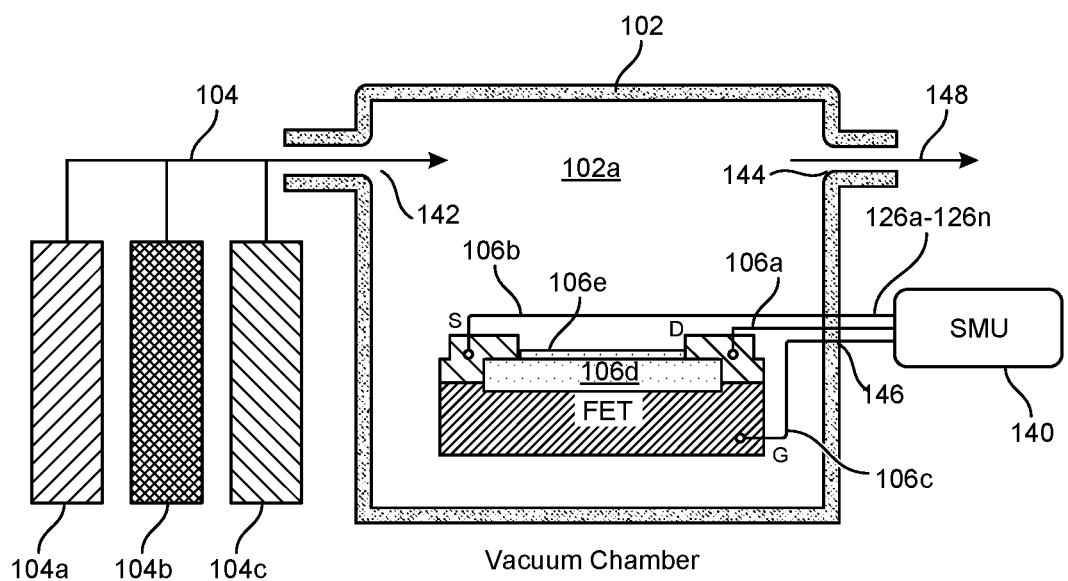
FIG. 3B illustrates a modified ALD reactor for in-situ measurements.

FIG. 3A illustrates a schematic of a back-gated FET 106 made by an ALD process. When processing in the ALD, the channel 106d that separates the source pad 106b and the drain pad 106a may include depositing at least one mono-layer crystal structure of $MX_2$ of transition metal dichalcogenides (TMDs), wherein the mono-layer crystal structure of $MX_2$ is formed by a layer of transition metal atom M sandwiched between two layers of chalcogen atom X. The layered transition metal dichalcogenides (TMDs) and two-dimensional (2D) materials therefore complement to Si complementary metal-oxide-semiconductor (CMOS) technology. The transition metal atom M may be selected from one of: molybdenum (Mo) and Tungsten (W), and the chalcogen atom X may be selected from one of: Sulfur (S), Selenium (Se) and Tellurium (Te). The at least one mono-layer crystal structure of $MX_2$ may be one of: $MoS_2$ (molybdenum disulfide) and $MoTe_2$ (molybdenum ditelluride).

The field-effect transistors (FETs) (106 in FIG. 3A) made with two-dimensional (2D) materials (e.g., 106d in FIG. 3A) often exhibit mobility below their theoretical limit, and strategies such as encapsulation with dielectrics (e.g., 106e in FIG. 3A) grown by atomic layer deposition (ALD) may be explored with various growth thickness to tune carrier concentrations and improve mobility. While molecular adsorbates may be known to dope 2D materials to influence charge scattering mechanisms, it is nevertheless, not well understood enough how ALD reactants (e.g., reactant gases 104a to 104c in FIG. 1A, 3B) may affect 2D transistors (106 in FIG. 3A) during growth. Thus the knowledge of in-situ or operando methodology helps to improve performance and process control.

It is demonstrated that exposures to the oxidants $H_2O$ and $O_2$ (e.g., reactant gases 104a to 104c in FIG. 1A, 3B) at temperatures and pressures relevant to the ALD may induce reversible electronic changes on $MoTe_2$ FETs (e.g., 106 in FIG. 3A), indicating negligible oxidation takes place during exposure. Furthermore, in-situ electronic measurements on $MoS_2$ and $MoTe_2$ FETs during ALD and $MoO_x$ (e.g., 106e in FIG. 3A) growth may reveal that significant field-effect mobility improvement may occur within the first five cycles (see FIGS. 4A, 5A) of $MoO_x$ growth. Further experiments confirm that this mobility enhancement may be effected by a modulation of the channel (e.g., 106d in FIG. 3A), rather than effected by the contacts, suggesting that mobility enhancement may be primarily due to screening of charged impurity scattering by the adlayer, rather than by a reduction in scattering centers through reactions or an increase in screening by free carriers. Due to the strong influence of the first <2 nm of deposition, the adlayer may be discontinuous and still evolving in stoichiometry. This disclosure may highlight a need for further assessment of nucleation layers and initial deposition chemistry, which may be more important than the bulk composition of the oxide (e.g., 106e in FIG. 3A) itself in optimizing performance and reproducibility.

As mentioned, layered transition metal dichalcogenides (TMDs) and other two-dimensional (2D) materials (e.g., $MoS_2$ and $MoTe_2$) are promising candidates for enhancing the capabilities of complementary metal-oxide-semiconductor (CMOS) technology. Though TMDs and other 2D materials may exhibit phenomena such as semiconductor-to-metal transitions that may allow for novel devices and can be scaled more aggressively than conventional CMOS technology, transistors made with 2D materials often exhibit mobility below their theoretical limit. Furthermore, unintentional doping still remains as an issue, including conventional substitutional doping that may degrade mobility. These challenges have motivated considerable efforts in this disclosure, both to improve mobility as well controlling doping of 2D materials without degrading mobility.

In addition to efforts to improve the starting quality of the 2D crystal (i.e., 2D materials) itself, channel mobility may be shown to improve significantly with ALD oxide encapsulation (e.g., 106e in FIG. 3A). With oxide encapsulation, two scattering sources may be impacted—(1) remote phonons are introduced from the encapsulation and (2) charged impurity (CI) scattering may be reduced. In implementation, the reactive gases 104a-104c used in the ALD may include water ($H_2O$) and oxygen (02) to form an oxide encapsulation as a dielectric layer to improve field effect mobility of the TMDs on unmasked area, wherein the oxide encapsulation may form $MoO_x$ (molybdenum oxide).

Conventionally, charged scattering centers of any type, such as impurities, adsorbates, and interface traps, are collectively referred to as charged impurities. In addition, remote phonons scatter carriers, and deposition of a dielectric could therefore, in principle, degrade mobility. However, CI scattering typically dominates in TMDs. Hence, dielectric encapsulation tends to improve the field effect mobility due to the increase in screening, which reduces the Coulomb potential of the CIs. To gain a more detailed understanding of the mobility dependence on the dielectric, it should be observed that measured devices with different thicknesses of dielectric especially the first few nanometers of dielectric may be disproportionately influential. Though not surprising, some questions should be raised that whether significant mobility enhancement may occur even before complete dielectric coverage, this may further suggests that ex-situ studies may not provide complete mechanistic understanding. For example, the density of CIs may also be reduced upon exposure to gaseous reactants which may smooth out the charge distribution. Furthermore, poorly-defined stoichiometry and instability in ambient of very thin nucleation layers may further complicate analysis of ex-situ experiments.

Although there may be many processes identified how to dope TMDs, however, not all the processes may yield improvement to carrier mobility. For example, substitutional doping tends to degrade mobility due to generation of defects that scatter carriers. Charge transfer doping with molecular adsorbates or metal nanoparticles may increase mobility, but this doping scheme generally would require additional processing to ensure long-term stability. Charge transfer doping with dielectric encapsulation has the potential to improve mobility and may promote ambient stability at the same time. In implementation, $MoO_x$ (e.g., 106e in FIG. 3A) grown with atomic layer deposition (ALD) may be used to dope $MoS_2$ (e.g., 106d in FIG. 3A) with electrons or holes. ALD-grown dielectric encapsulation may be desirable because it may be performed at temperatures compatible with polymeric materials and can be used on large area substrates.

It was also found that doping TMDs (e.g., 106d in FIG. 3A) with dielectric encapsulation (e.g., 106e in FIG. 3A) has been attributed to transferring of charges due to differences in energy level alignment, that diffusion of ions or fixed charges may produce the observed changes in carrier concentration. In addition, oxidants used in dielectric growth such as $H_2O$ and $O_2$ have been reported to dope air-unstable TMDs such as $MoTe_2$ (e.g., 106d in FIG. 3A). Insight into processes that influence carrier concentration during ALD oxide encapsulation (e.g., 106e in FIG. 3A) of TMDs may be essential for understanding doping and mobility enhancement of TMDs.

In-situ monitoring of electronic changes in a FET during ALD growth may deepen understanding of both mobility enhancement and doping. For example, oxidants typically used in ALD growth have been shown to oxidize TMDs such as $MoTe_2$ (e.g., 106d in FIG. 3A), which changes the electronic band structure. In addition, molecular adsorbates may dope TMDs. Direct and real-time measurement of the electronic effects of ALD oxidants has the potential to reveal the origins of such changes. Furthermore, transport in TMDs such as $MoTe_2$ (e.g., 106d in FIG. 3A) in the early cycles of dielectric growth, even before a well-defined film is grown, may provide new insights into how doping and mobility evolve, ruling out some mechanisms of action. The semiconductor-dielectric such as $MoO_x$ (e.g., 106e in FIG. 3A) interface may be created in the first few growth cycles (e.g., see FIGS. 3C, 4A, 5A) at a time when each ALD half-cycle may induce significant changes in mobility and carrier concentration. Such conditions cannot be reliably reproduced by ex-situ measurements on a series of films of different thickness, thus further motiving in-situ measurements during film formation. Such in-situ measurements could also be considered operando measurements, as the $MoS_2$ and $MoTe_2$ FET (e.g., 106 in FIG. 3A) is probed under typical electrical operating conditions, but during processing steps that may impact the electrical output characteristics.

In-situ electronic measurements on $MoS_2$ and $MoTe_2$ FETs during ALD $MoO_x$ growth, shows that the dielectric deposition may improve the mobility by factors of 2 to 9. The in-situ studies showed that most of the enhancement occurs within the first few atomic layer deposition cycles, implying that dielectric-induced changes in mobility and carrier concentration may in fact occur prior to formation of a continuous, stoichiometric, and air-stable dielectric. The change in temperature dependence of mobility from subsequent ex-situ variable-temperature measurements indicates that the improved mobility is predominantly due to screening of charged impurities, rather than reaction with or passivation of defects. The sub-monolayer dielectric regime, which may be difficult to study with ex-situ measurements, may be of paramount importance to the mobility-enhancing effects of dielectrics and merits further exploration with in-situ and operando measurements.

Figure 3C:
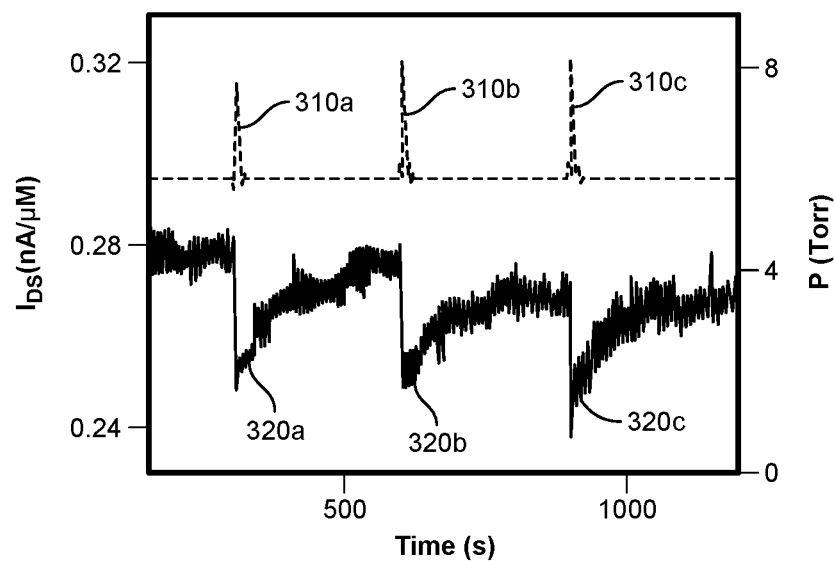
FIGS. 3C-3D illustrate Pulsed oxygen and water exposure with reversible changes with time in current density.
Figure 3D:
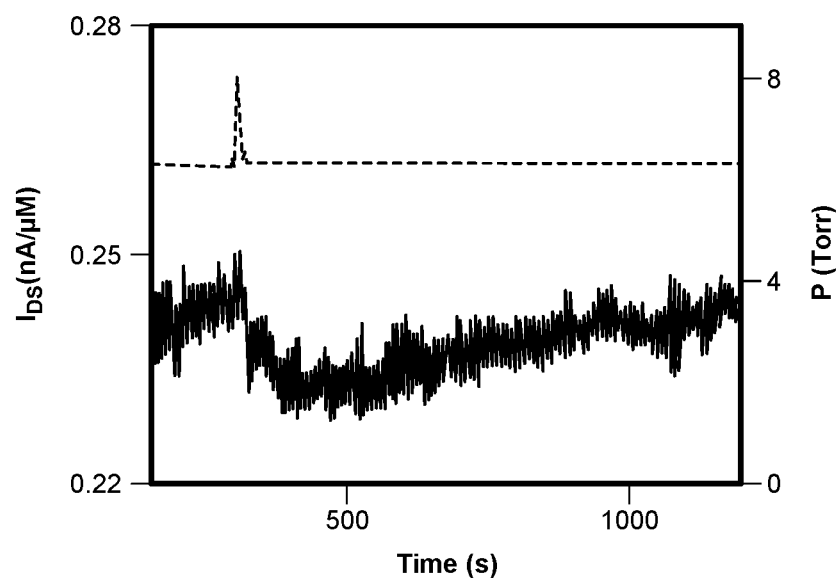
Figure 3E:
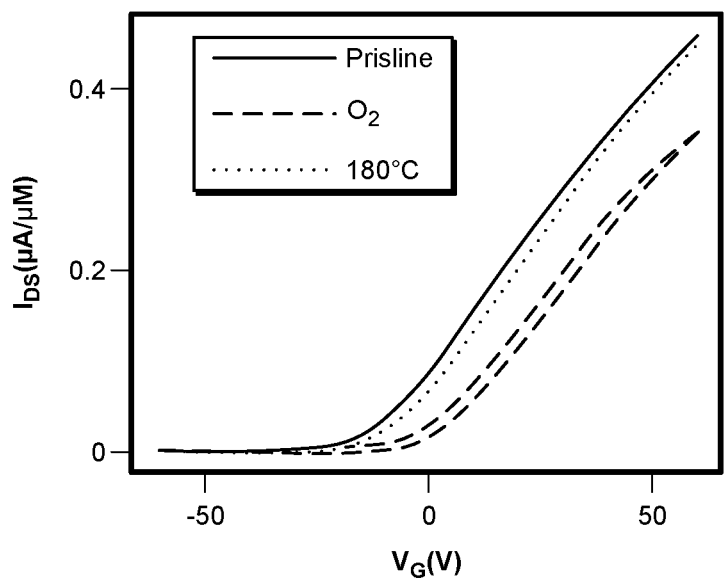
FIGS. 3E-3F illustrate irreversible transport characteristics with annealing.
Figure 3F:
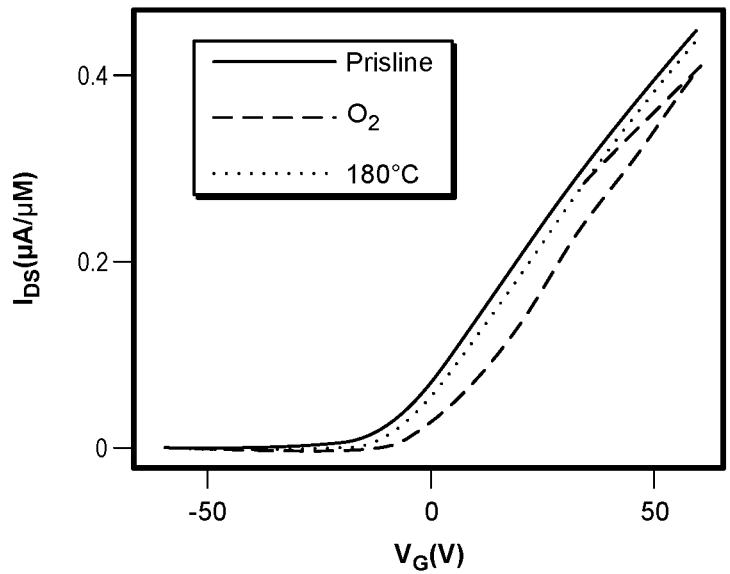

FIGS. 3E, 3F disclose some data and results of FETs fabricated from $2H-MoTe_2$ crystals which were grown using chemical vapor transport and $MoS_2$ crystals were purchased from SPI Supplies. To fabricate FETs, $MoTe_2$ and $MoS_2$ crystals (e.g., 106d in FIG. 3A) were mechanically exfoliated onto 285 nm $SiO_2$/Si wafers (e.g., 106c in FIG. 3A), with degenerately doped Si as the back gate 106f A standard two-step electron-beam lithography process was used to define thermally evaporated gold contacts, and the mobility and carrier concentration were extracted. To understand the evolution of mobility $\mu$ and carrier concentration n in $MoTe_2$ FETs during dielectric deposition by ALD, experiments were first conducted to isolate the effects of oxidant exposure. Towards that end, devices were measured before (i.e., pristine), during, and after exposure (see FIGS. 3E-3F) to $H_2O$, $P_2$, and $O_3$ (104a to 104c) at temperatures and pressures comparable to those used for ALD. $MoTe_2$ FETs were measured in a standard 3-terminal configuration (e.g., drain D, source S and gate G in FIG. 3A) in a modified ALD reactor 102 (see FIG. 1A).

FIGS. 4A-4E illustrate evolution of electronic properties of $MoS_2$ during ALD $MoO_x$ growth. Measurements, exposures, and growths were performed at 80° C. unless otherwise noted. Transfer curves (see FIGS. 3E-3F) taken in vacuum immediately before (i.e., pristine) and after oxidant exposure reveal that water and oxygen both have a small but measurable effect on carrier concentration and a negligible effect on field-effect mobility. Mobility may vary by less than 1 $cm^2$/Vs from the starting value of 25 $cm^2$/Vs (see FIG. 4E), which may be negligible considering the ca. 3 $cm^2$/Vs uncertainty introduced by an increase in hysteresis. After exposure to oxygen, the FET is depleted by $2.2 \times 10^{18}$ $cm^{-3}$ (a 22% reduction), while after exposure to water, the FET is depleted by $0.6 \times 10^{18}$ $cm^{-3}$ (a 7% reduction), which is less than 20% of the doping observed with subsequent dielectric encapsulation. This modest shift is likely due to oxygen or water molecules adsorbed on the surface acting as acceptors as previously reported. The shift is reversible; baking the device at 180° C. without breaking vacuum restores the original transfer curves, consistent with charge-transfer doping by weakly-bound species.

The change in transport can also be monitored in real time via conductivity. Electrons are the majority carriers, wherein the current is proportional to the conductivity $\sigma = ne\mu_e$, where e is the unit charge, and depletion of the n-type channel should manifest as a reduced conductivity. For example, FIGS. 3C and 3D show sharp decreases in current 320a to 320c (normalized per unit width) upon exposure to pulses of oxygen and water 310a to 310c, respectively, with conductivity mostly recovering on the time scale of minutes (see FIG. 3D). Similar to ambient exposure at room temperature, changes in electronic properties from exposure to oxygen and water at 80° C. can be reversed with annealing (see FIGS. 3E and 3F).

It was concluded that, at the ALD growth temperature and the timescale for exposure to ALD reactants (30 min or less), neither oxygen nor water reacts irreversibly with $MoTe_2$. The same behavior can be expected for a more stable TMDs such as $MoS_2$, where oxidation with oxygen or water on the time scale of tens of minutes may require temperatures of at least 250° C. Meanwhile, harsher conditions such as annealing at 250° C. reportedly oxidatively dope $MoTe_2$. Similarly, the in-situ measurements during exposure to $O_3$ seemed to show that 03 modifies transport in $MoTe_2$ irreversibly, consistent with prior reports on p-type transport after partial oxidation of $MoTe_2$ to $MoO_3$. Hence, the studies of changes in doping and mobility during growth reported below may be limited to oxygen and water as oxidants.

Figure 4C:
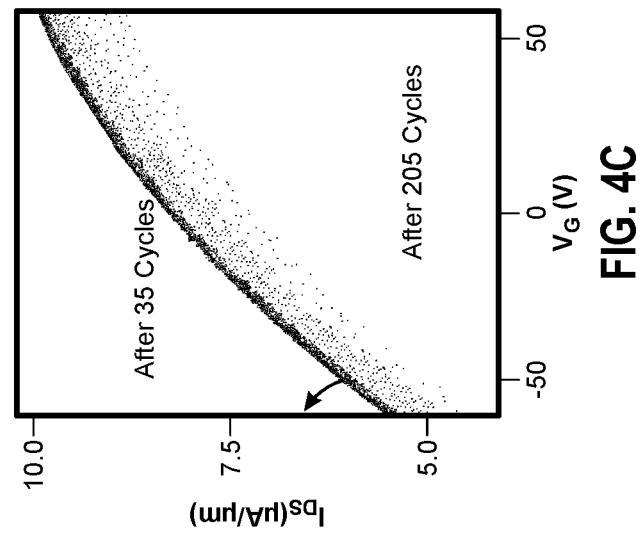
FIGS. 4A-4E illustrate evolution of electronic properties of $MoS_2$ during ALD $MoO_x$ growth.
Figure 4A:
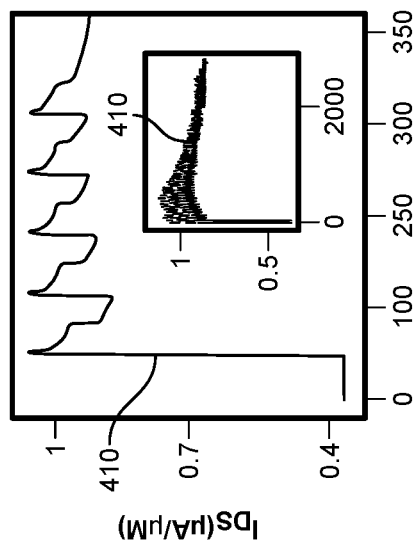

Results of in-situ measurements on $MoS_2$ and $MoTe_2$ FETs were shown in FIGS. 4A to 4E and FIGS. 5A to 5E, respectively, when being carried out in a modified Ultratech Savannah S200, for example, with in-situ quartz crystal microbalance (QCM) and insulated lid under continuous, viscous flow conditions with 20 sccm ultra-high purity $N_2$ (Airgas) as a purge gas. $MoO_x$ was grown at 80° C. in a two-step cycle consisting of a $Mo(NMe_2)_4$ dose, a 30 s purge, a $H_2O$ dose, and a 30 s purge. Following the growth of ca. 10 nm of $MoO_x$, ca. 10 nm of $Al_2O_3$ was grown by alternating doses of trimethyl aluminum (Sigma-Aldrich) and $H_2O$ to ensure ambient stability. During growth, the channel current was measured continuously at a fixed gate voltage in accumulation (Vg=55 V unless otherwise noted), as shown in FIGS. 4B and 4C, 5B and 5C. Every five cycles, growth was paused to measure the transfer characteristic (VDS set at 0.5 V), enabling the extraction of transport parameters. FIG. 4A show the real-time current density IDS 410 during the first five cycles of $MoO_x$ growth; the inset shows current (per unit width) during the entire ALD growth.

Figure 6:
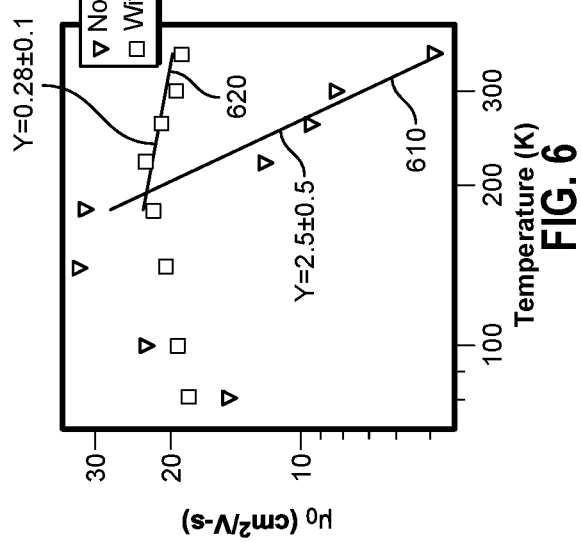
FIG. 6 illustrates a variation of $MoTe_2$ mobility with temperature before and after $MoO_x$ encapsulation.

Electrical measurements with corresponding chamber pressure transients may be shown in each transfer curve (FIGS. 4B and 4C), which carrier concentration n (FIG. 4D) and intrinsic mobility μ0 (FIG. 4E) were extracted by fitting to a model for FET transfer characteristics in accumulation with a mobility attenuation factor (such as that used in the "Y-function" method in FIG. 6). It was shown that both the extracted carrier concentration and mobility may increase sharply at the beginning of $MoO_x$ growth: after the first five cycles, for $MoS_2$, n increased by 60% and μ0 increased by 160%. It is shown in FIG. 4A that fully 80% of the mobility change of the entire growth may occur within the first 5 cycles, where the dielectric is expected to be less than 1 nm thick.

Significant changes in electrical properties may evidently occur even within the first cycle of deposition, during which IDS increases by 140%, since $\sigma_n$=$ne\mu_n$, changes in conductivity reflect changes in mobility, carrier concentration, or both. For example, the small downward changes in conductivity with oxidant exposure after the first metal-organic half-cycle are consistent with changes in work function (and thus charge transfer) as the local stoichiometry shifts from oxygen-rich to oxygen-deficient and back again. Considering that the mobility increases 160% during the first 5 cycles, and that the conductivity after one cycle is comparable to the conductivity after 5 cycles, it is likely that a majority of the change in mobility occurs in the first cycle (the electron concentration after one cycle would need to be substantially above its value at 5 cycles for this not to be the case).

Figure 4E:
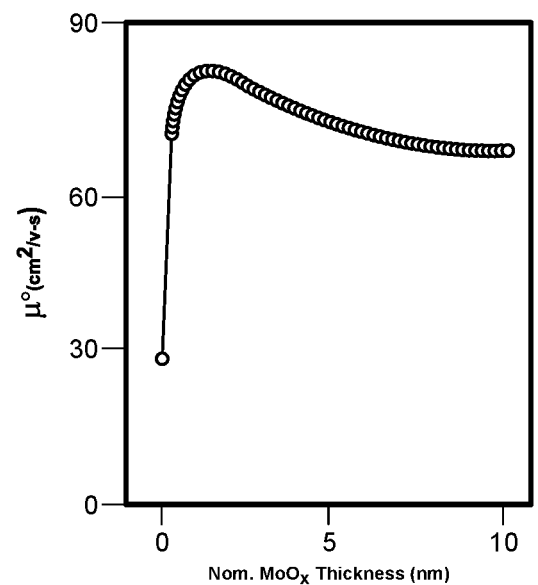
Figure 5A:
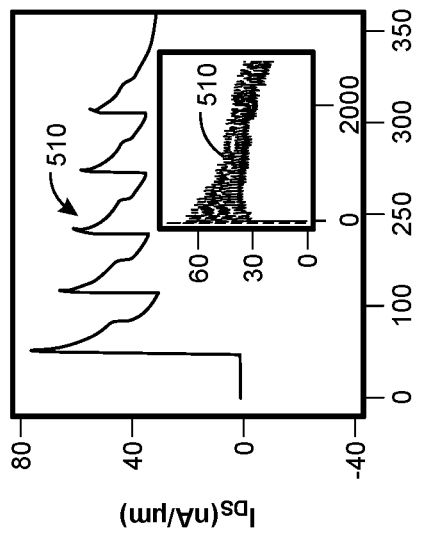
FIGS. 5A-5E illustrate evolution of electronic properties of $MoTe_2$ during ALD $MoO_x$ growth.

FIG. 5A shows that qualitatively similar behavior may also be seen in the $MoTe_2$ FET measured in parallel. FIGS. 5A and 5AA show that $MoTe_2$ current density IDS 510 and transfer curves collected every five ALD cycles are shown on linear (see FIG. 5B) and log (see FIG. 5C) scales. Similar to $MoS_2$, after the first five ALD cycles, there is a sharp increase in n (by 50%, FIGS. 3d) and μ0 (by 840%, FIG. 3e) for $MoTe_2$. More than 75% of the total change in μ0 occurs in the first five cycles, as observed with $MoS_2$. Likewise, IDS was increased by 2100% at the end of the first ALD cycle, once again indicating significant changes in transport with less than a monolayer of dielectric. It was found that while the large increase in mobility for both $MoS_2$ and $MoTe_2$ occurs within the first (nominal) nanometer of $MoO_x$ growth, the mobility decreases slightly after ca. 2 nm of growth (see FIGS. 4E and 5E), suggesting that the stoichiometry of the dielectric stoichiometry is still evolving. This evolution terminates upon deposition of an $Al_2O_3$ capping layer, which may indicate that alumina prevents diffusion species into or out of the underlying $MoO_x$.

An increase in mobility may indicate that carrier scattering has been reduced. Intrinsic phonons, polar surface optical phonons, charged impurities (CI), and atomic (uncharged) defects are all sources of scattering in 2D FETs, but intrinsic electron-phonon scattering and atomic defect scattering rates are typically smaller than (remote) polar surface optical phonon scattering and charged impurity scattering. The distinct temperature dependencies of these scattering processes may be used to determine the dominant process at a given temperature. Near room temperature, remote optical phonons can become the dominant scattering mechanism, implying that oxide encapsulation may degrade mobility in pristine samples. However, for both $MoS_2$ and $MoTe_2$, it was observed a large overall increase in mobility with $MoO_x$ encapsulation, indicating that CI scattering limits mobility. It was found that impurities in the semiconductor are not the only type of charged impurity; CI scattering occurs with any large, localized variations in the potential landscape of the semiconductor, which may be due to impurities, adsorbates, or interface traps.

As shown in FIG. 6, the observed decrease in CI scattering during encapsulation with a dielectric may be interpreted as increased dielectric screening of CIs as the thickness of the dielectric increases. Strictly speaking, however, during the initial evolution recorded here, the surface is not yet covered with a continuous dielectric. Indeed, the large increase in current with the first dose of metal-organic precursor suggests that incomplete coverage of the surface with oxygen-deficient species, perhaps including molecular species, is enough to significantly enhance transport in a TMD.

In the absence of a continuous encapsulation layer with a well-defined dielectric constant, it may consider how heterogeneous adsorbed molecules or patchy oxide clusters effect the charge transfer and screening that produce the observed changes in conductivity. It was determined that even modest coverages of molecules (<1/nm2 for an area coverage of <10%) may significantly neutralize, displace, or screen CIs. Furthermore, it was determined that this $MoO_x$ growth nucleates without intramolecular bonding to the underlying $MoS_2$. Thus, the evolution of mobility and carrier concentration throughout the deposition process may still be described in terms of changes in CI screening and charge transfer doping. Furthermore, control measurements in which the contact regions were masked by a diffusion barrier confirm that the observed changes are dominated by changes in the channel and not the contacts.

To refine understanding of the improvement in mobility and potentially distinguish between the screening and elimination of charged defects, it was analyzed that the temperature dependence of the mobility (extracted from the transfer curves). In general, the power law exponent γ, where $\mu \sim T^{-\gamma}$, depends on the dominant source of scattering. In conventional semiconductors in a regime in which CI-scattering dominates, mobility typically increases with temperature (a negative γ) due to decreasing interaction time of carriers and CIs with increasing thermal velocity. In TMDs whose room temperature mobility may be limited by CI scattering, mobility generally decreases with increasing temperature (near room temperature) because CI scattering is partially mitigated by free-carrier screening, which diminishes with increasing temperature.

FIG. 6 further shows that the unencapsulated $MoTe_2$ device displays a γ of 2.5±0.5, confirming that mobility is limited by CI scattering, as expected based on the observed mobility increase with MoO$_x$ deposition. The weaker temperature dependence of mobility after the complete oxide deposition ($\gamma=0.28\pm0.1$) further implies dielectric screening is the primary origin of the reduction in CI scattering. Simply reducing the density of CI centers (or increasing the free-carrier screening by changing the carrier concentration) would increase the mobility without significantly changing the exponent; one would still expect a decrease in free-carrier screening as the Debye length increases with increasing temperatures.

Meanwhile, the screening by a polarizable medium such as a dielectric or polarizable molecules does not significantly decrease with increasing temperature, so the reduction in CI scattering is preserved at higher temperatures, resulting in a smaller $\gamma$. Thus, it was not only confirmed that CI scattering is reduced, but suggested that it is reduced primarily through dielectric or molecular screening, rather than the increase in free-carrier screening or a reduction in the number of charged defects by, for example, chemical reaction with ALD precursors.

FIGS. 3A to 3F discloses an in-situ measurements of 2D FETs. FIG. 3A shows a schematic of a back-gated FET. FIG. 3B shows a schematic of the modified ALD reactor for in-situ measurements. SMU is source-measure unit. FIG. 3C shows pulsed oxygen and water, FIG. 3D shows exposures on MoTe$_2$ at 180° C. with VG set at 0 V and VSD set at 0.05 V, showing reversible changes with time in current density. FIGS. 3E and 3F, show transport characteristics (VSD set at 0.1 V) are reversible with annealing at 180° C. after 30 minute exposure to oxygen or water at 80° C. Transport characteristics (VSD set at 1 V) are irreversible with annealing when exposed for 5 min to ozone at 80° C.

Figure 4B:
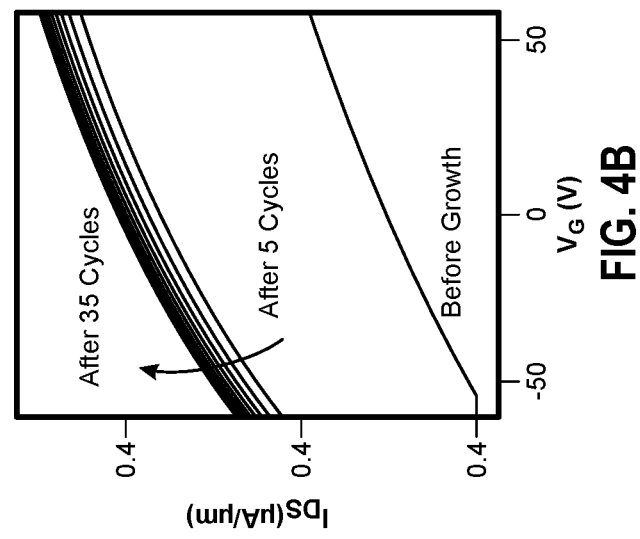
Figure 4D:
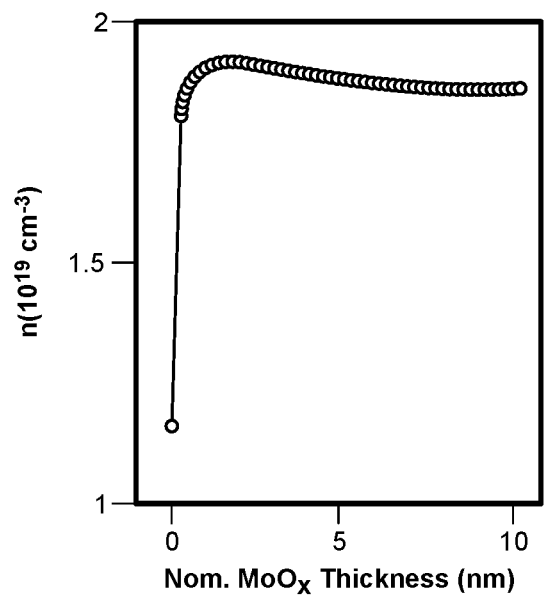

FIG. 4A to 4E shows an evolution of electronic properties of MoS$_2$ during ALD MoO$_x$ growth. FIG. 4A shows a current density IDS during the first five cycles of growth. Inset: IDS during the entire growth. FIG. 4B shows consecutive transfer curves collected every five ALD cycle for 35 cycles showing increasing current density (indicated by arrow). FIG. 4C shows transport characteristics collected for the rest of the growth, during which current density decreases, as indicated by the arrow. FIGS. 4D, 4E show carrier concentration n and intrinsic mobility μ0 are extracted from results in FIGS. 4B and 4C, showing significant increase at the beginning of growth.

Figure 5C:
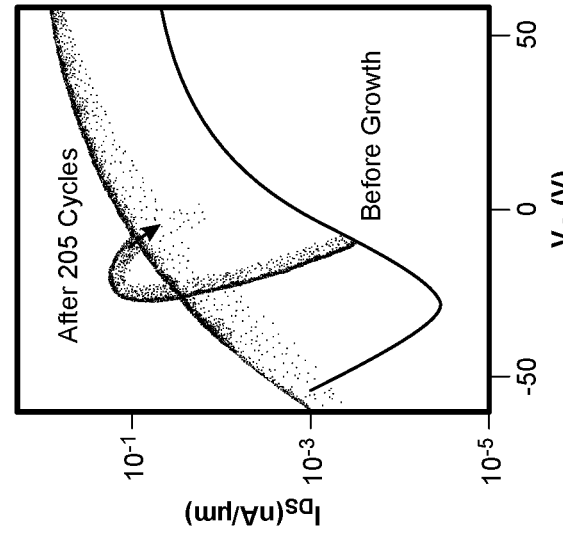
Figure 5B:
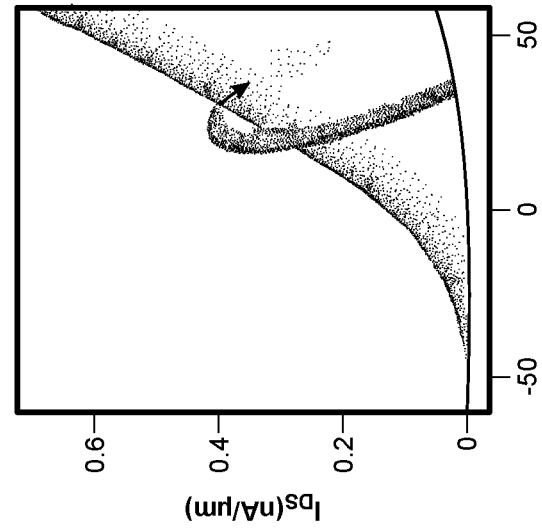
Figure 5E:
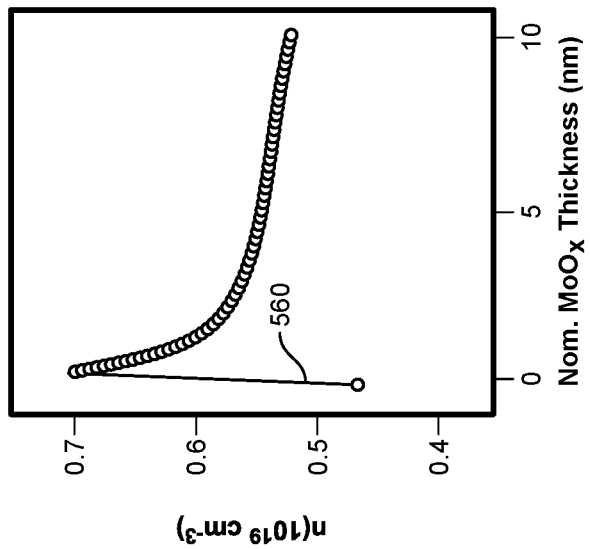
Figure 5D:
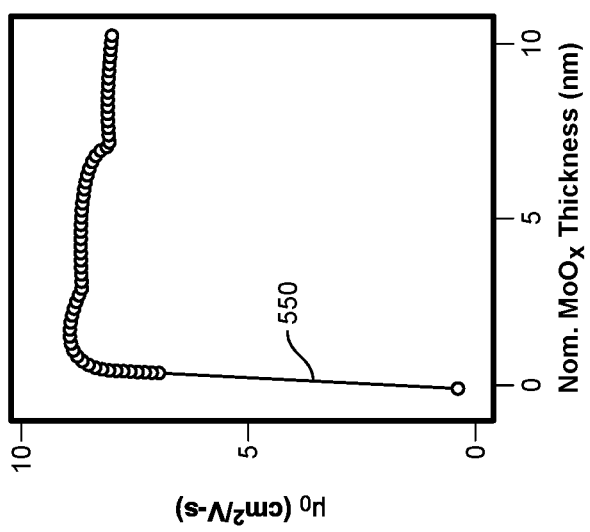

FIGS. 5A to 5E show an evolution of electronic properties of MoTe$_2$ during ALD MoO$_x$ growth. FIG. 5A shows a current density IDS during the first five cycles of growth. Inset: IDS during the entire growth. FIGS. 5B and 5C show consecutive transfer curves collected every five ALD cycles for the entire growth in linear and log scale. The increase in minimum current is partially due to an increase in leakage current (on the order of 10 nA) through MoO$_x$. Arrows indicate sequence of transfer curves. FIGS. 5D and 5E show that extracted carrier concentration n and intrinsic mobility μ0 show significant increases at the beginning of growth.

FIG. 6 shows a variation of MoTe$_2$ mobility with temperature before and after MoO$_x$ encapsulation. μ~$\gamma$ dependence changes from $\gamma=2.5$ to $\gamma=0.28$ with MoO$_x$ encapsulation. The error in $\gamma$ is one standard deviation of the linear fit in the 180-353 K range.

In summary, in-situ experiments on TMD FETs encapsulated with ALD oxide dielectrics revealed the disproportionate influence of the initial oxide deposition cycles on device performance. Carrier concentration and mobility both increase dramatically within the first five ALD cycles. The increase in mobility may be contributed to a reduction in CI scattering due to increased dielectric screening of CIs, rather than changes in free-carrier screening or the elimination of CIs through chemical reaction. Further improvements in performance might be realized by optimizing the initial exposure, potentially with conditions or species that differ from the steady state oxide growth conditions. It was found that, for example, that seeding layers or oxidation treatments have been used to promote CVD or ALD growth of dielectrics on two-dimensional materials, but are not necessarily independently optimized for preservation or enhancement of mobility. Further progress in mobility enhancement through encapsulation may be realized via processes in passivation procedures than dielectric deposition, where the interface and first nanometer of material may be optimized separately from the bulk of the dielectric. The in-situ methodology using the chip carrier 120 demonstrated an efficient way to study these and other questions of evolving interfaces and transport in nanoscale electronic devices such as 2D FETs.

Other systems, methods, features and advantages will be, or will become, apparent to one with skill in the art upon examination of the figures and detailed description. It is intended that all such additional systems, methods, features and advantages be included within this description, be within the scope of the disclosure, and be protected by the following claims. Steps mentioned in the disclosure may be carried out in any sequence or orders without limitation to achieve the intended objectives.

We claim:

1. A system for in-situ monitoring of semiconductor devices during chemical vapor deposition, comprising:
   a reactor having a sealed chamber for carrying out chemical vapor deposition (CVD) on semiconductor devices, wherein the reactor is configured with a plurality of openings for passaging of reactive gases and for in-situ monitoring of the semiconductor devices within the sealed chamber during the CVD; and
   a chip carrier configured to be disposed within the sealed chamber, wherein the chip carrier is configured for mounting at least one partially fabricated semiconductor device on a base, wherein the chip carrier comprises a plurality of metallized bonding pads disposed along both peripheral edges on a same surface of the base for making electrical connections to one or more metallized pads or contacts on the at least one partially fabricated semiconductor device through bonding wires, such that each of the plurality of metallized bonding pads is individually and electrically connected to a respective port on the chip carrier for in-situ monitoring of electrical parameters of the at least one partially fabricated semiconductor device during the CVD, wherein electrical currents or electrical signals are exchanged between the at least one partially fabricated semiconductor device and a source-measure unit (SMU) disposed external to the sealed chamber through a connector and wire harness that is electrically coupled to a plurality of ports on one peripheral edge of the chip carrier within the sealed chamber,
   wherein the SMU comprises a plurality of measurement equipment configured to perform in-situ measurements of the electrical parameters of the at least one partially fabricated semiconductor device during the CVD.

2. The system according to claim 1, wherein the chip carrier is made from a high melting point polymer comprising PolyTetraFluoroEthylene (PTFE).

3. The system according to claim 1, wherein each of the metallized source pad and the metallized drain pad of one of the plurality of partially fabricated back-gated FETs is electrically connected through a respective bond wire to a corresponding metallized bonding pad disposed along the one peripheral edge of the base of the chip carrier, wherein each metallized bonding pad is electrically connected to a respective port on the chip carrier for mating to a respective jack or plug of the connector and wire harness.

4. The system according to claim 3, wherein each of the metallized drain pad, the metallized source pad and a gate remains being shorted together on another peripheral edge of the chip carrier through connecting to a shorting piece during transport and when being connected to the connector and wire harness on the one peripheral edge of the chip carrier prior to electrical parameters measurements, wherein the shorting piece on the another peripheral edge of the chip carrier is to be first removed prior to proceeding with the electrical parameters measurements by the SMU.

5. The system according to claim 1, wherein each of the plurality of metallized bonding pads disposed along both peripheral edges is electrically connected to each other as a pair through electrically connecting to a corresponding pair of ports which are disposed along both peripheral edges of the chip carrier.

6. The system according to claim 1, wherein the at least one partially fabricated semiconductor devices comprise a plurality of partially fabricated back-gated Field-Effect Transistors (FETs) fabricated on a portion of a wafer, wherein each of the plurality of partially fabricated back-gated FETs having at least a metallized source pad and a metallized drain pad on a topside surface separated by a semiconductor channel, wherein a gate is disposed on a backside surface facing oppositely away from the source pad and the drain pad.

7. The system according to claim 6, wherein when the CVD performs an atomic layer deposition (ALD), the channel that separates the source pad and the drain pad comprising at least one mono-layer crystal structure of $MX_2$ of transition metal dichalcogenides (TMDs), wherein the mono-layer crystal structure of $MX_2$ is formed by a layer of transition metal atom M sandwiched between two layers of chalcogen atom X, and the at least one mono-layer crystal structure of $MX_2$, wherein the transition metal atom M is selected from one of: molybdenum (Mo) and Tungsten (W), and the chalcogen atom X is selected from one of: Sulfur (S), Selenium (Se) and Tellurium (Te).

8. The system according to claim 7, wherein the at least one mono-layer crystal structure of $MX_2$ comprises one of: $MoS_2$ (molybdenum disulfide) and $MoTe_2$ (molybdenum ditelluride).

9. The system according to claim 8, wherein the ALD uses the reactive gases comprising water ($H_2O$) and oxygen ($O_2$) to form an oxide encapsulation as a dielectric layer to improve field effect mobility of the TMDs on unmasked area, wherein the oxide encapsulation comprises $MoO_x$ (molybdenum oxide).

10. The system according to claim 1, wherein the in-situ measurements of the electrical parameters of the at least one partially fabricated semiconductor device during the CVD comprising measurements over a defined time period of: channel currents, transconductance, bias voltage, carrier mobility, oxide encapsulation thickness, chamber temperature, chamber pressure and flow rate of reactant gases.

11. A method for in-situ monitoring of semiconductor devices during chemical vapor deposition, comprising:
disposing a chip carrier within a sealed chamber of a reactor for carrying out in-situ monitoring of semiconductor devices within the sealed chamber during chemical vapor deposition (CVD), wherein the reactor is configured with a plurality of openings for passaging of reactive gases and for in-situ monitoring of the semiconductor devices during the CVD,
wherein the chip carrier is configured for mounting at least one partially fabricated semiconductor device on a base, and
the chip carrier comprises a plurality of metallized bonding pads disposed along both peripheral edges on a same surface of the base for making electrical connections to one or more metallized pads or contacts on the at least one partially fabricated semiconductor device through bonding wires, such that each of the plurality of metallized bonding pads is individually and electrically connected to a respective port on the chip carrier for in-situ monitoring of electrical parameters of the at least one partially fabricated semiconductor device during the CVD, wherein electrical currents or electrical signals are exchanged between the at least one partially fabricated semiconductor device and a source-measure unit (SMU) disposed external to the sealed chamber through a connector and wire harness that is electrically coupled to a plurality of ports on one peripheral edge of the chip carrier within the sealed chamber; and
performing by a plurality of measurement equipment of the SMU, in-situ measurements of the electrical parameters of the at least one partially fabricated semiconductor device during the CVD.

12. The method according to claim 11, wherein the chip carrier is made from a high melting point polymer comprising PolyTetraFluoroEthylene (PTFE).

13. The method according to claim 11, wherein each of the metallized source pad and the metallized drain pad of one of the plurality of partially fabricated back-gated FETs is electrically connected through a respective bond wire to a corresponding metallized bonding pad disposed along the one peripheral edge of the base of the chip carrier, wherein each metallized bonding pad is electrically connected to a respective port on the chip carrier for mating to a respective jack or plug of the connector and wire harness.

14. The method according to claim 13, comprising:
shorting each of the metallized drain pad, the metallized source pad and a gate on another peripheral edge of the chip carrier through connecting to a shorting piece during transport and when being connected to the connector and wire harness on the one peripheral edge of the chip carrier prior to electrical parameters measurements; and
removing the shorting piece on the another peripheral edge of the chip carrier prior to proceeding with the electrical parameters measurements by the SMU.

15. The method according to claim 11, wherein each of the plurality of metallized bonding pads disposed along both peripheral edges is electrically connected to each other as a pair through electrically connecting to a corresponding pair of ports which are disposed along both peripheral edges of the chip carrier.

16. The method according to claim 11, wherein the at least one partially fabricated semiconductor devices comprise a plurality of partially fabricated back-gated Field-Effect Transistors (FETs) fabricated on a portion of a wafer, wherein each of the plurality of partially fabricated back-gated FETs having at least a metallized source pad and a metallized drain pad on a topside surface separated by a semiconductor channel, wherein a gate is disposed on a backside surface facing oppositely away from the source pad and the drain pad.

17. The method according to claim 16, wherein when the CVD performs an atomic layer deposition (ALD), the channel that separates the source pad and the drain pad comprising at least one mono-layer crystal structure of $MX_2$ of transition metal dichalcogenides (TMDs), wherein the mono-layer crystal structure of $MX_2$ is formed by a layer of transition metal atom M sandwiched between two layers of chalcogen atom X, and the at least one mono-layer crystal structure of $MX_2$, wherein the transition metal atom M is selected from one of: molybdenum (Mo) and Tungsten (W), and the chalcogen atom X is selected from one of: Sulfur (S), Selenium (Se) and Tellurium (Te).

18. The method according to claim 17 wherein the at least one mono-layer crystal structure of $MX_2$ comprises one of: $MoS_2$ (molybdenum disulfide) and $MoTe_2$ (molybdenum ditelluride).

19. The method according to claim 18, wherein the ALD uses the reactive gases comprising water ($H_2O$) and oxygen ($O_2$) to form an oxide encapsulation as a dielectric layer to improve field effect mobility of the TMDs on unmasked area, wherein the oxide encapsulation comprises $MoO_x$ (molybdenum oxide).

20. The method according to claim 11, wherein the in-situ measurements of the electrical parameters of the at least one partially fabricated semiconductor device during the CVD comprising measurements over a defined time period of: channel currents, transconductance, bias voltage, carrier mobility, oxide encapsulation thickness, chamber temperature, chamber pressure and flow rate of reactant gases.

\* \* \* \* \*